United States Patent [19]
Inohara et al.

[11] Patent Number: 5,948,698
[45] Date of Patent: Sep. 7, 1999

[54] MANUFACTURING METHOD OF SEMICONDUCTOR DEVICE USING CHEMICAL MECHANICAL POLISHING

[75] Inventors: Masahiro Inohara, Tokyo; Tadashi Matsuno, Kanagawa-ken, both of Japan

[73] Assignee: Kabushiki Kaisha Toshiba, Kawasaki, Japan

[21] Appl. No.: 08/951,164

[22] Filed: Oct. 15, 1997

[30] Foreign Application Priority Data

Oct. 15, 1996 [JP] Japan ................................ P08-291243

[51] Int. Cl.$^6$ .................................................. H01L 21/302
[52] U.S. Cl. ............................ 438/691; 438/692; 438/693
[58] Field of Search .................... 438/690, 691, 438/692, 693

[56] References Cited

U.S. PATENT DOCUMENTS

| | | | |
|---|---|---|---|
| 5,753,562 | 5/1998 | Kim | 438/424 |
| 5,792,707 | 8/1998 | Chung | 438/633 |
| 5,804,490 | 9/1998 | Fiegl et al. | 438/424 |

Primary Examiner—Benjamin Utech
Assistant Examiner—Kin-Chan Chen
Attorney, Agent, or Firm—Banner & Witcoff, Ltd.

[57] ABSTRACT

A method for fabricating a semiconductor device at low cost is provided in which a mask layer having a very large polishing selection ratio is used as a polishing stop film by forming the polishing stop film in self-alignment. An object layer to be flattened is formed on a substrate. The object layer contains an irregularity. A polishing stop film which is polished at a slower rate and a mask layer which is polished at about the same rate as the object layer are deposited on the object layer. Then, the mask layer on a high level portion of the object layer is removed by chemical-mechanical polishing. The polishing stop film is etched other than under the mask layer, so that the polishing stop film at the high level portion and side wall of the step is removed. Because the polishing stop film at the convex portions (high level portion) is removed by etching utilizing a chemical reaction without using chemical-mechanical polishing, it is possible to select a material for the polishing stop film which is polished at a very slow rate. After that, the mask layer and the object layer at the convex portion are removed by CMP to level off the object layer with the concave portion.

22 Claims, 20 Drawing Sheets

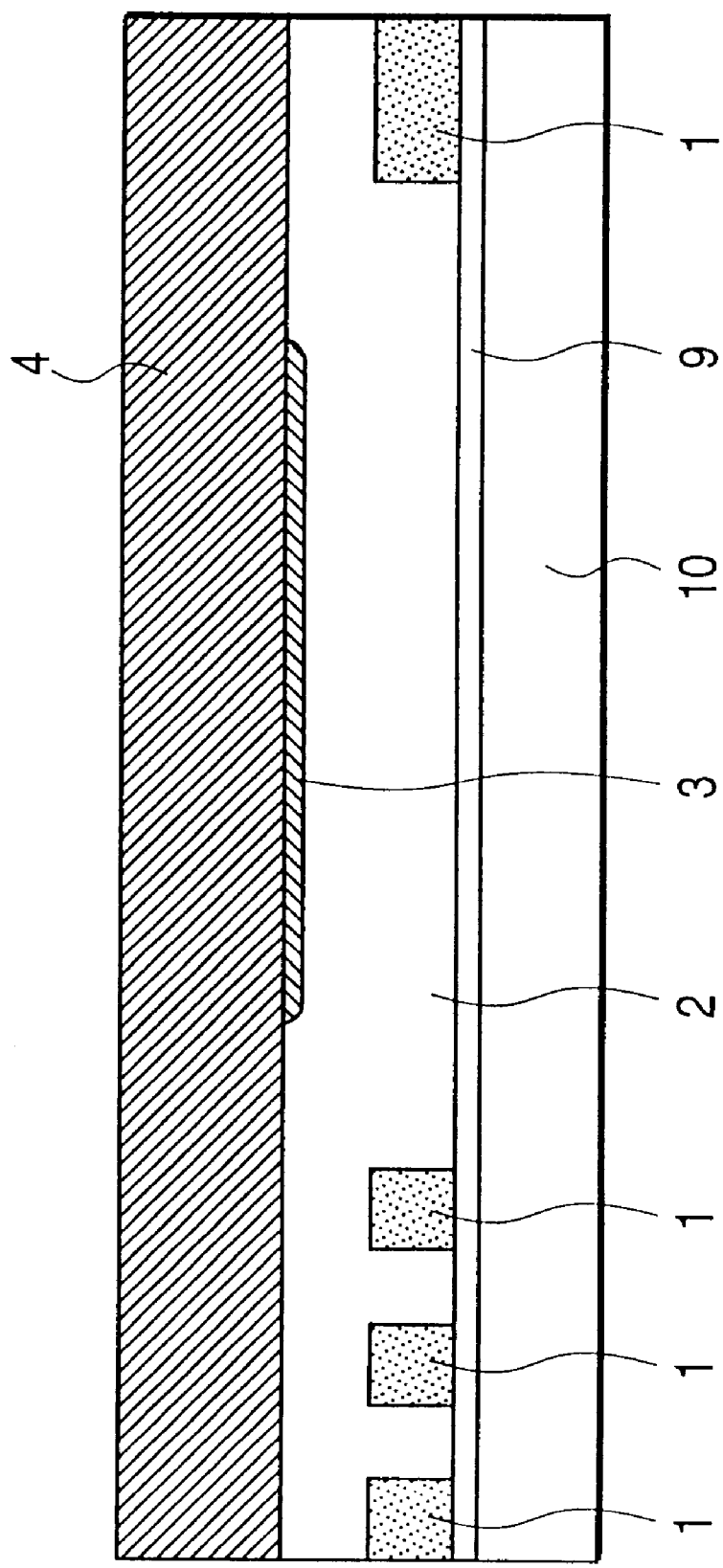

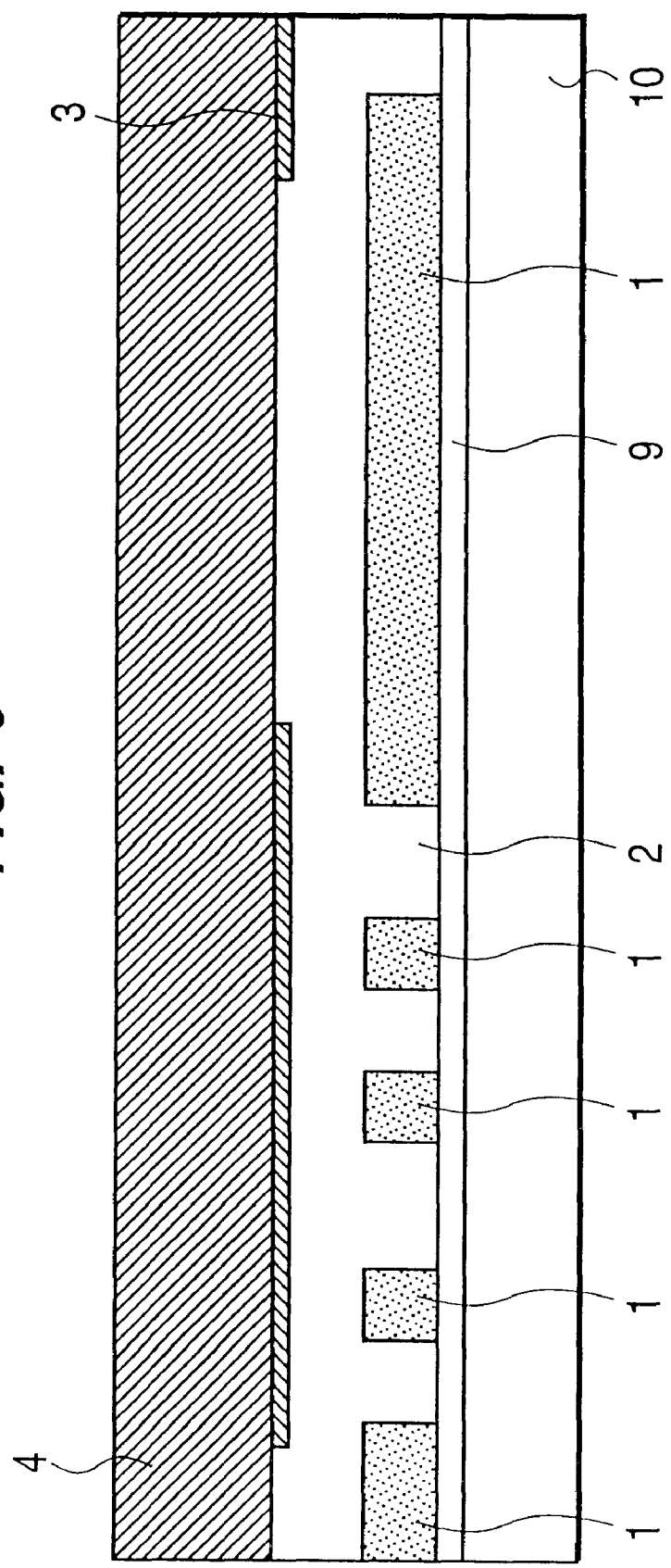

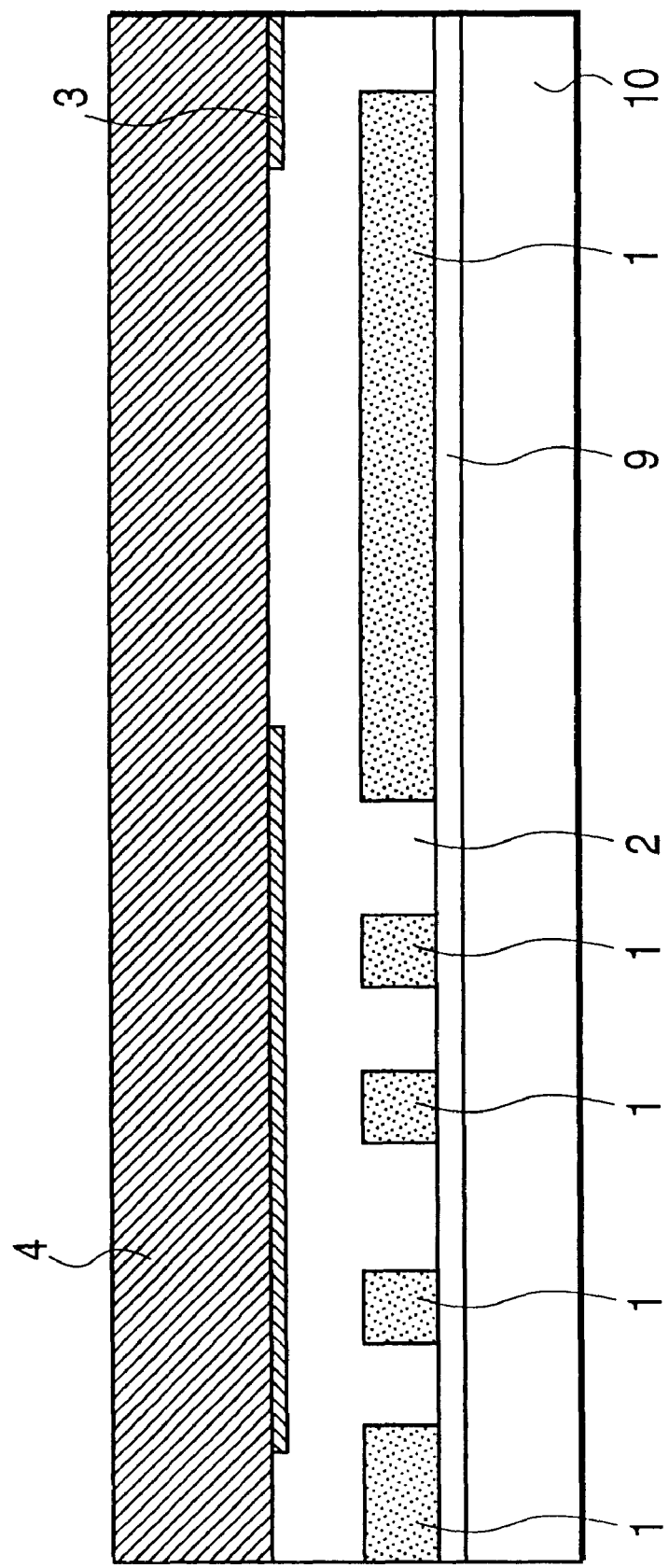

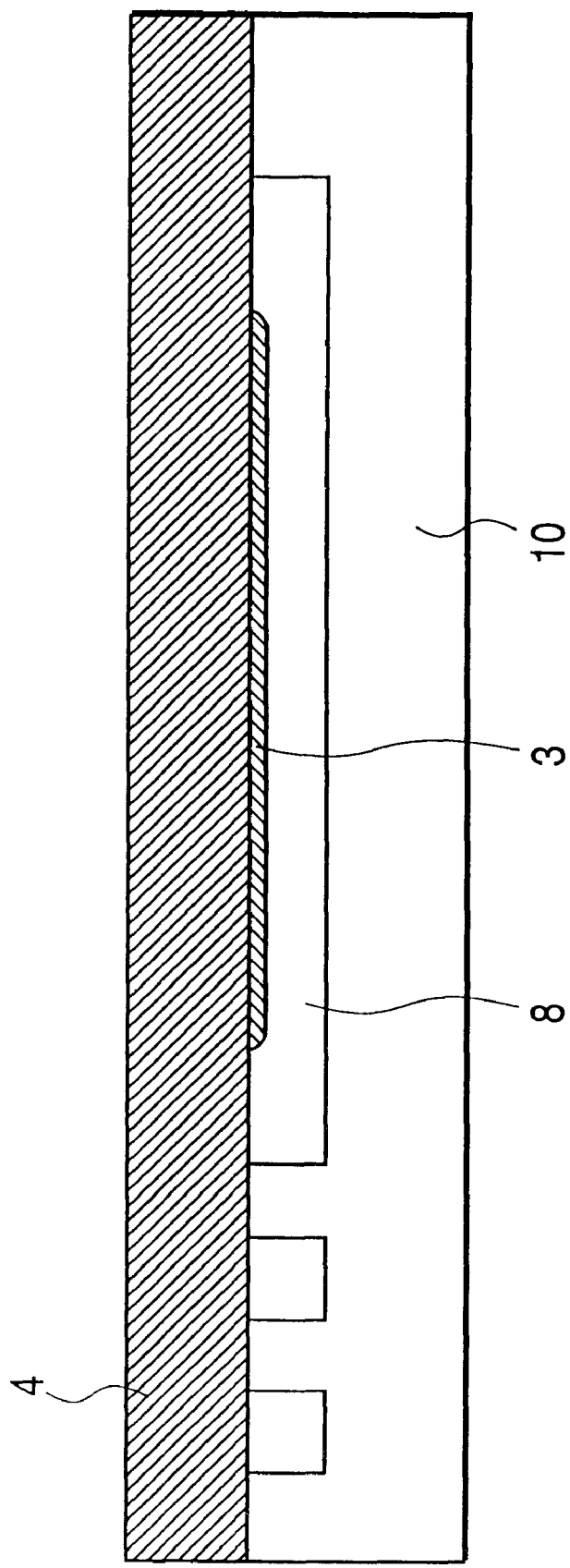

MANUFACTURING METHOD OF SEMICONDUCTOR DEVICE USING CHEMICAL MECHANICAL POLISHING

BACKGROUND OF THE INVENTION

1. Field of the Invention

The present invention relates to a manufacturing method of a semiconductor device for flattening a deposition layer formed on a semiconductor substrate which has an irregularity by means of chemical-mechanical polishing (CMP) and more particularly to a method for forming a polishing stop film.

2. Description of Related Art

As is well known, today the size of semiconductor ICs has been greatly reduced and their functions have improved tremendously. Semiconductor manufacturing processes have likewise greatly improved so that these changes in ICs can be commercially implemented. With each improvement, new problems arise. For example, with the increased micronization of wiring patterns in high-density integrated circuits, decreasing of a depth of focus in the well-known lithography process occurs and the difficulty for treatment of and working on so-called "irregular steps" has increased remarkably. Therefore, it has become essential to flatten a deposition film, such as an insulating film, formed on the surface of a semiconductor substrate so as to implement high precision works. Presently, CMP is being used as one of means for realizing the flattening of the deposited film.

By way of background, the general operation of a typical polishing machine for CMP which will be explained.

First, a polishing plate pad is placed on a horizontal table. A polishing plate is mounted on the polishing pad. A polishing cloth for polishing wafers is plastered on the polishing plate. A drive shaft is connected at the center of the polishing plate pad and the polishing plate in order to turn. This drive shaft is turned by a motor via a turn belt. Meanwhile, a wafer is adsorbed on an adsorption plate, on which a template and an adsorption cloth is provided. The wafer is positioned so as to face to the polishing cloth. The adsorption plate is connected with a drive shaft. This drive shaft is turned by the motor via gears. The drive shaft is fixed to a driving table which is disposed above the polishing plate so as to move in the vertical direction.

Because the driving table moves vertically by the shaft, the wafer fixed to the adsorption plate is either pressed to the polishing cloth or is separated from the polishing cloth. The wafer is polished by flowing a polishing agent between the wafer and the polishing cloth to a desired completeness. The wafer may be moved in the X-Y directions (horizontal direction) during the polishing by another driving system.

Referring first to FIG. 15, the problems encountered with the prior art will be described. In FIG. 15, a main surface of a silicon semiconductor substrate 10 is shown on which wiring lines 1 are formed on top of an insulating film 9. An interlayer insulating film 2 such as a chemical vapor deposition (CVD) SiO$_2$ film is deposited on the wiring lines 1. Because the insulating film 2 has a generally constant thickness, irregularities are created on the surface of the interlayer insulating film 2 corresponding to the wiring lines 1 on the semiconductor substrate 10. Thus, the surface of the insulating film 2 has high level portions (convex portions) 22 and low level portions (concave portions) 21. As shown in FIG. 15, convex portions 22 are created in the region above the wiring lines 1 and a concave portion 21 is created in the region above the insulating film 9 where the wiring lines 1 are not formed. The depth and width of these irregularities depends on the wiring lines 1 on the surface of the semiconductor substrate 10. A polishing stop film 3 such as carbon is deposited on the whole surface of the interlayer insulating film 2.

When CMP is implemented in this state, a polishing cloth 4 of a polishing machine polishes the main surface of the semiconductor substrate 10 coated by the polishing stop film 3. Then, the convex portions 22 above the wiring lines 1 on the surface of the semiconductor substrate 10 are polished as shown in FIG. 15. The polishing is implemented until the polishing stop film 3 at the bottom of the concave portion 21 in the middle of the figure and the region of the convex portions 22 are leveled off to a level equal to the deepest concave portion 21. At this point, the flattening is completed.

According to the method shown in FIG. 15, the polishing stop film 3 on the convex portions 22 is first removed by using the polishing cloth. Therefore, the polishing stop film 3 must have both the qualities of preventing the CMP and of being removed by the CMP. That is, the material of the polishing stop film 3 must be able to be removed in a reasonable amount of time at a rate that is slower than the rate at which the interlayer insulating film 2, (i.e. the film to be polished), is polished. It is difficult in practice to ensure the existence of a large polishing selection ratio (defined as (the polishing rate of the interlayer insulating film 2)/( the polishing rate of the polishing stop film 3)). If the polishing cloth 4 contacts with the bottom of the concave portion 21 of the polishing stop film 3 in an amount of time which exceeds the time obtained by dividing the thickness of the interlayer insulating film 2 (i.e. the film to be polished) by the polishing rate of the polishing stop film 3, it polishes and removes not only the convex portions 22 but also the interlayer insulating film 2 at the concave portion 21 (see FIG. 17a). If CMP is continued at that point, a new concave portion is created where there has been no underlying step and the flattening cannot be achieved perfectly (see FIG. 17b).

In the method shown in FIG. 16, the insulating film 9, the wiring lines 1 and the interlayer insulating film 2 such as a CVD SiO$_2$ film are formed on the surface of the semiconductor substrate 10 and the polishing stop film 3 such as carbon is deposited on the whole surface of the interlayer insulating film 2 in the same manner with those shown in FIG. 15. However, a photoresist is patterned on the polishing stop film 3 by using lithography after depositing the polishing stop film 3. Then, the polishing stop film 3 is etched by using the patterned photoresist as a mask to leave the polishing stop film 3 only at the concave portion 21 of the interlayer insulating film 2.

The lithography is used for transferring a pattern onto the surface of a semiconductor in the semiconductor technology field. The lithographic process is composed of steps of transferring a mask pattern to a photoresist, etching an underlying film by using the photoresist pattern and removing the photoresist thereafter.

In order to avoid the polishing cloth 4 from contacting with the bottom of the wide width concave, the polishing stop film 3 is left only at the bottom of the concave portion 21, as shown in FIG. 16.

The polishing is implemented until the polishing stop film 3 at the bottom of the concave portion 21 in the middle of the figure and the region of the convex portions 22 are leveled off. Then, the flattening is completed. The use of the method shown in FIG. 16 allows a material having a very large polishing selection ratio for the polishing stop film 3.

However, it has a problem that it requires the lithographic process which comprises complicated steps and which considerably increases the production cost of the semiconductor device.

SUMMARY OF THE INVENTION

An object of the present invention is to provide a method for manufacturing a semiconductor device by applying a film having a very large polishing selection ratio due to self-alignment method without increasing production costs. The polishing selection ratio is obtained by dividing a polishing rate of an object film to be polished by a polishing rate of a polishing stop film.

The present invention includes steps of forming a film to be polished, forming a polishing stop film, forming a mask layer, implementing first CMP, etching the polishing stop film, and implementing second CMP and flattening.

According to a first embodiment of the present invention, a method for manufacturing a semiconductor device is provided in which a first film is formed on a layer to be flattened which has an irregularity. A second film is formed on the first film, and the second film is polished on a high level portion of the irregularity. Next, the first film is removed on the high level portion and the high level portion is polished.

In a second embodiment of the present invention, a method for manufacturing a semiconductor device is provided for a device having a trench on a semiconductor substrate. The steps include forming a first film on a layer to be flattened which has an irregularity, forming a second film on the first film, polishing the first film on a high level portion of the layer, removing the first film on the high level portion of the layer, and polishing the high level portion of the layer.

According to a third embodiment of the present invention, a method for manufacturing a semiconductor device is provided for a device having a semiconductor element region on a semiconductor substrate. According to the third embodiment, a trench is formed surrounding the semiconductor element region. Next an insulating film is formed on the substrate. A first film is then formed on the insulating film, and a second film is formed on the first film. The second film is polished on a high level portion of the layer, the first film on the high level portion of the layer is removed, and the high level portion of the layer is polished.

BRIEF DESCRIPTION OF DRAWINGS

The present invention will now be described in more detail with reference to preferred embodiments of the invention, given only by way of example, and illustrated in the accompanying drawings in which:

FIG. 3 is a further section view of the semiconductor substrate for explaining the first illustrative embodiment of the present invention.

FIG. 6 is an additional section view of the semiconductor substrate for explaining the third illustrative embodiment of the present invention.

FIG. 8 is an additional section view of the semiconductor substrate for explaining the fourth illustrative embodiment of the present invention.

FIG. 10 is an additional section view of the semiconductor substrate for explaining the fifth illustrative embodiment of the present invention.

DETAILED DESCRIPTION OF PREFERRED EMBODIMENTS

A first embodiment of the present invention will be explained with reference to FIGS. 1 through 3.

Figure 1A:
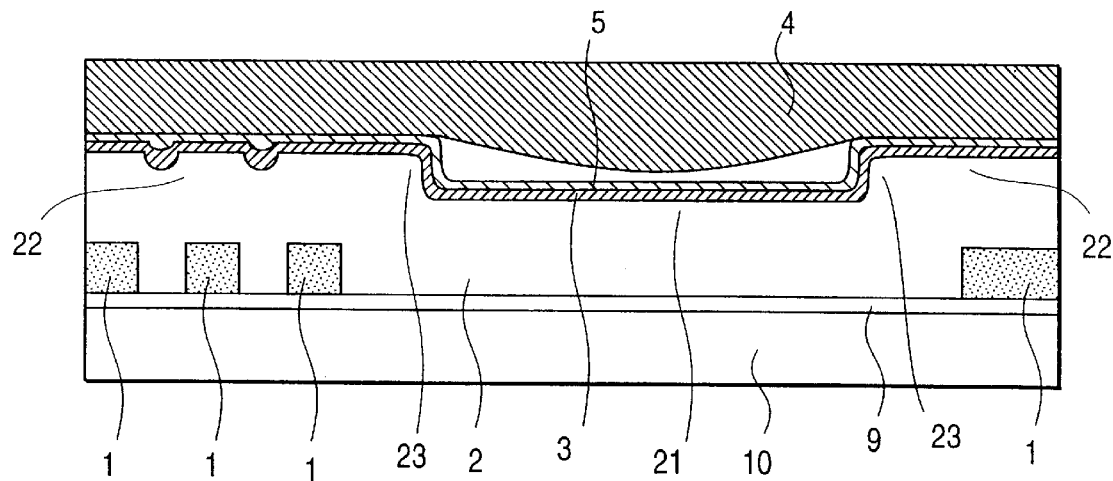
FIGS. 1(a) and 1(b) are section views of a semiconductor substrate for explaining a first illustrative embodiment of the present invention.
Figure 1B:
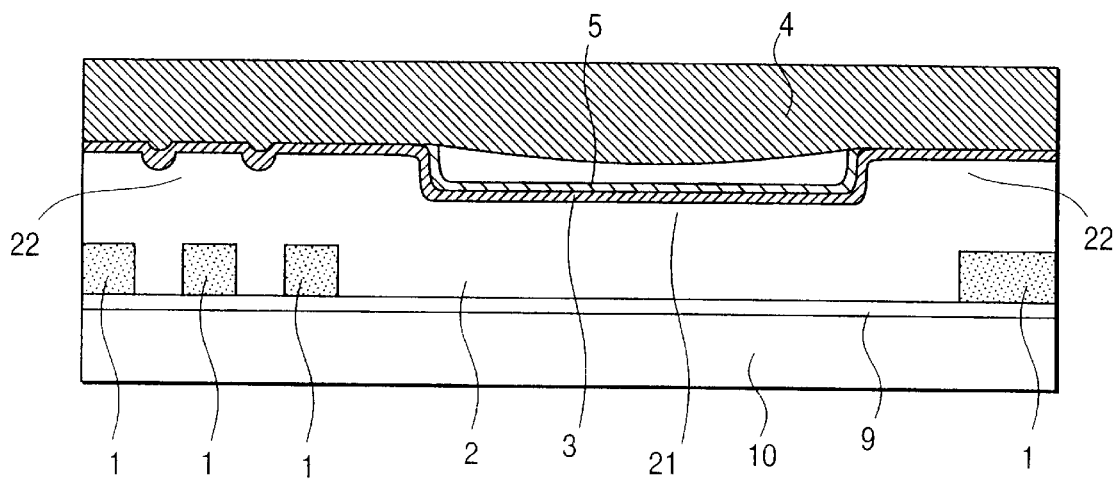

Wiring lines 1 made of a metal such as aluminum or an alloy are formed on the main surface of a silicon semiconductor substrate on the top of an insulating film 9 made of $SiO_2$ or the like. An interlayer insulating film 2 made of a chemical vapor deposition (CVD) $SiO_2$ film or the like is deposited on the wiring lines 1. Because the wiring lines 1 are disposed selectively on the main surface of the semiconductor substrate 10, irregularities are created on the surface of the interlayer insulating film 2. Specifically as shown in FIG. 1(a), convex portions 22 are formed on the surface of the interlayer insulating film 2 in a region above the wiring lines 1 and a concave portion 21 is formed in a region above the insulating surface film 9 where no wire is formed. Steps 23 between the concave portion 21 and the convex portions 22 are about 400 nm to about 1500 nm.

A polishing stop film 3 made of carbon is deposited on the whole surface of the interlayer insulating film 2 at a thickness of about 10 nm by means of CVD or sputtering. Beside carbon, silicon nitrate ($Si_3N_4$), poly-silicon, or metallic silicide such as tungsten silicide may be used as the polishing stop film 3 in the present invention. According to the present invention, a material used as polishing stop film 3 must polish at a very slow rate. Preferably, the selected polishing stop film is polished at the rate less than $1/10$ of the rate at which the interlayer insulating film 2 is polished. The thickness of the polishing stop film 3 is selected in consideration of the height of the wire, conditions of the CMP and the material of the polishing stop film 3. Further, mask layer 5 made of a material which is polished at about the same rate as the interlayer insulating film 2 is deposited on the polishing stop film 3 at a thickness of about 100 nm to about 500 nm by means of CVD or sputtering. A silicon oxide film, for example, is used as the mask layer 5.

Then the polishing cloth 4 contacts the mask layer 5 on the main surface (FIG. 1(a)). The mask layer 5 at the convex portions 22 is polished and removed during the polishing by the polishing cloth 4 (FIG. 1(b)).

Next the polishing stop film 3 at the convex portions 22 and the side wall of the step are etched and removed by, for example, dry etching which is well known in semiconductor technology. Importantly, the mask layer 5 at concave portions 21 is not etched (FIG. 2(a)). A space exists between the mask layer 5 at the side wall of the step and the insulating film 2.

Figure 2A:
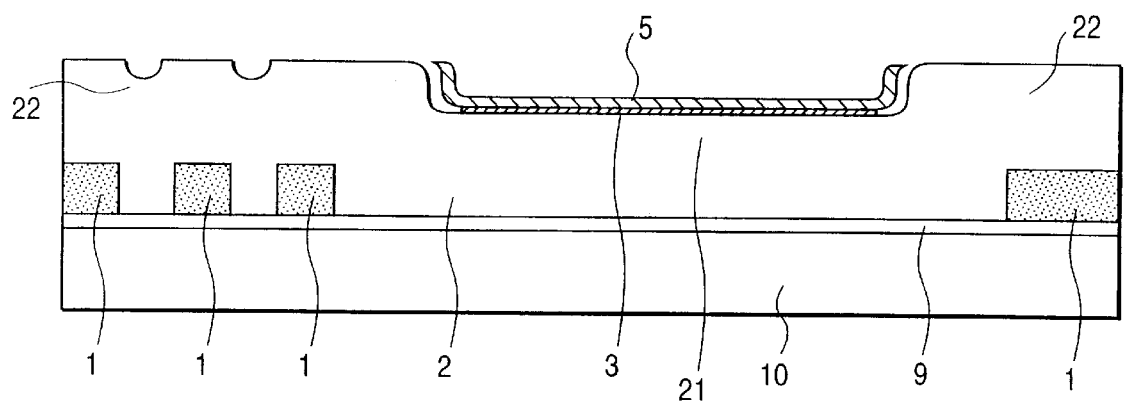
FIGS. 2(a) through 2(d) are additional section views of the semiconductor substrate for explaining the first illustrative embodiment of the present invention.
Figure 2B:
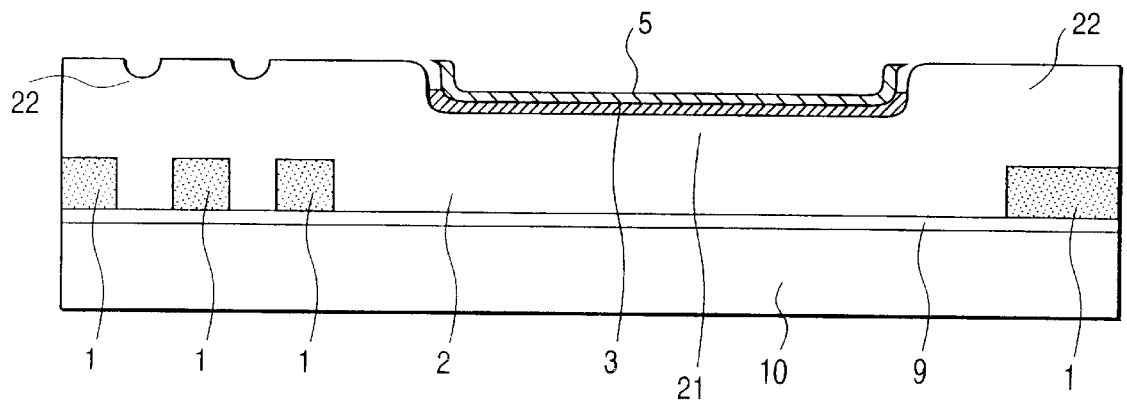
Figure 2C:
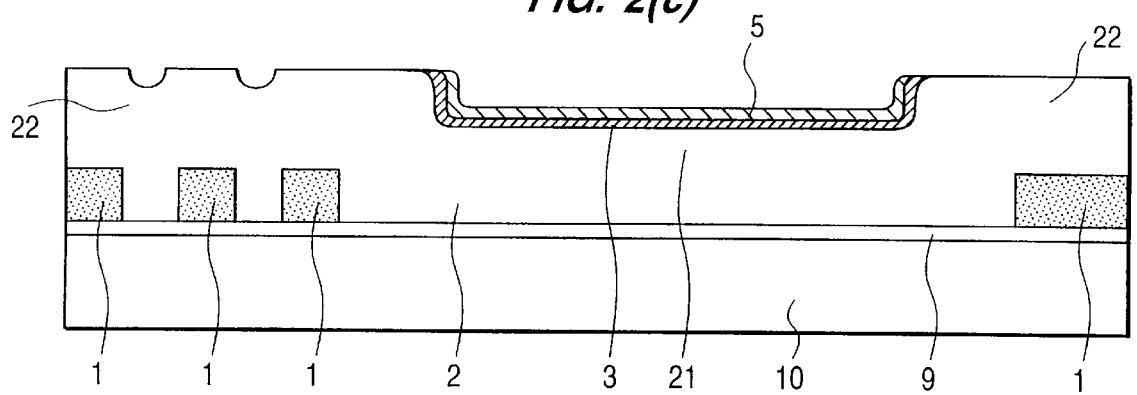

Then, depending on the etching condition, three conditions may exist: 1) the polishing stop film 3 is removed except for along the bottom of the concave portion 21 as shown in FIG. 2(a), 2) the polishing stop film 3 is removed up to the middle of the side wall of the concave portion 21 as shown in FIG. 2(b) and 3) only the polishing stop film 3 at the convex portions 22 is removed as shown in FIG. 2(c).

Figure 2D:
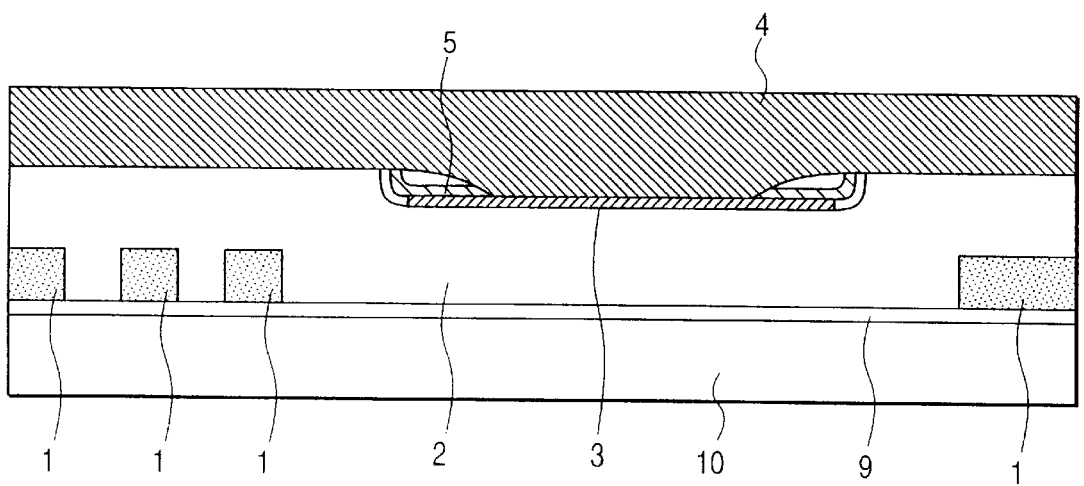

The thickness of the mask layer 5 may be changed by the etching condition for removing the polishing stop film 3. After that, the insulating film 2 at the convex portions 22 and the mask layer 5 at the concave portion 21 are removed at the same time by CMP as shown in FIG. 2(d). According to the present invention, after polishing, the interlayer insulating film 2 at the concave portion 21 is not removed and the interlayer insulating film 2 is flattened completely as shown in FIG. 3.

While the polishing cloth 4 contacts with the polishing stop film 3 at the concave portion 21 of the interlayer insulating film 2, when the step decreases, the polishing stop film 3 will not be removed and hence the interlayer insulating film 2 at the concave portion 21 will not be removed because the rate at which the polishing stop film 3 is polished is very slow.

According to the present invention, the polishing stop film is formed at the concave portion by self-alignment, thus a considerable increase of the manufacturing cost of the semiconductor device can be avoided because a photomask for patterning the polishing stop film is unnecessary. Further, because the polishing stop film 3 exists only at the concave portion, the material of the polishing stop layer can have a very slow polishing ratio.

A second embodiment will be explained with reference to FIGS. 4(a) and 4(b).

In the second embodiment, after etching the polishing stop film 3 and further after removing the mask layer 5 by etching utilizing chemical reactions, the step of the film to be polished is flattened by chemical-mechanical polishing (CMP). The steps up to what is shown in FIG. 2(a) of the first embodiment are carried out also in the present embodiment.

Figure 4A:
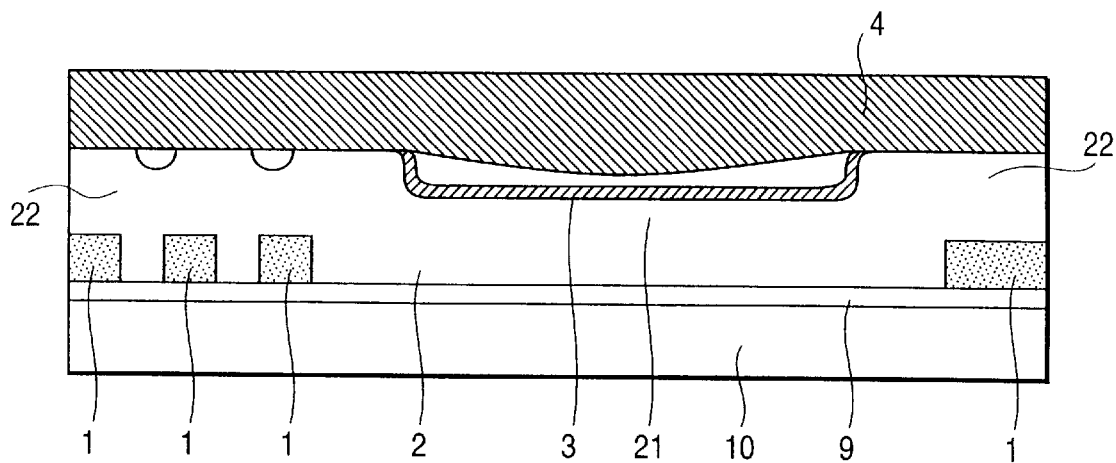
FIGS. 4(a) and 4(b) are section views of a semiconductor substrate for explaining a second illustrative embodiment of the present invention.
Figure 4B:
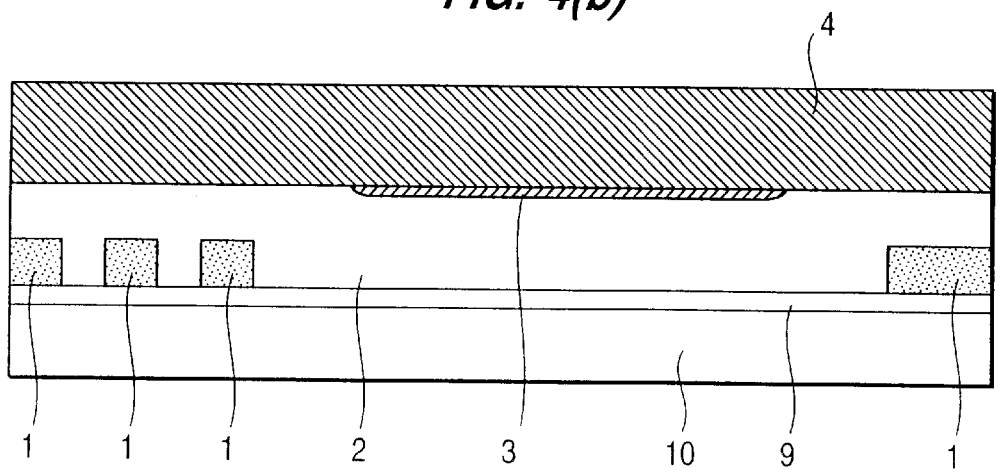

The mask layer 5 on the whole surface is removed (FIG. 4(a)). Then, the convex portions 22 of the interlayer insulating film 2 are removed by CMP (FIG. 4(b)). The etching rate for the mask layer 5 is greater than that for the polishing stop film 3. The mask layer 5 is removed by etching in which the mask layer is etched at a rate greater than that at which the polishing stop film 3 is etched. Because the interlayer insulating film 2 is polished after removing mask layer 5, material which is polished at a rate slower than that at which the interlayer insulating film 2 is polished can be used for the mask layer 5. This embodiment is particularly effective when a material which is polished at slower rate than that at which the film to be polished is polished is used for mask layer 5.

Because CMP is implemented after leaving the polishing stop film 3 only at the concave portion 21 without using the lithographic technology, the flattening can be readily performed at low cost. Further, because the polishing stop film exists only at the concave portion the material of the polishing stop layer can have a very large polishing selection ratio.

A third embodiment will be explained with reference to FIGS. 5 and 6.

Figure 5A:
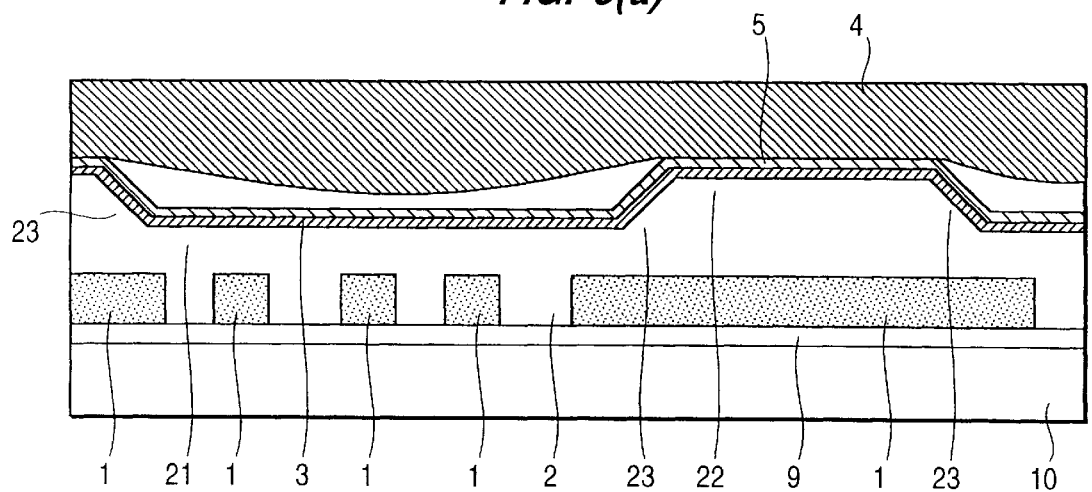
FIGS. 5(a) through 5(d) are section views of a semiconductor substrate for explaining a third illustrative embodiment of the present invention.

Wiring lines 1 made of aluminum or the like are formed on the insulating film 9 made of $SiO_2$ or the like on the surface of silicon semiconductor substract 10. An interlayer insulating film 2, such as a CVD $SiO_2$, is deposited on the wiring lines 1 by CVD with bias-sputtering. Where CVD involving the bias-sputtering is used, etching of corners at both sides of convex portions 22 and the deposition on the whole surface of the substrate are implemented at the same time. The interlayer insulating film 2 above the wiring lines 1, and especially above the wide wiring lines, is thick in shape. On the other hand, interlayer insulating film 2 is thin in region above the narrow wire, as shown in FIG. 5(a). Accordingly, the interlayer insulating film 2 having an irregularity is formed on the substrate. Step 23 between the concave portion 21 and the convex portions 22 are about 400 nm to about 1500 nm. A polishing stop film 3 made of, for example, carbon is deposited at a thickness of about 10 nm on the whole surface of the interlayer insulating film 2 by means of CVD or sputtering. A material which is polished at a very slow rate, i.e. as slow as less than about $1/10$ of that at which the interlayer insulating film 2 is polished, is used as the polishing stop film 3. The thickness of the polishing stop film 3 is determined in consideration of the height of the wire, conditions of the CMP and the material of the polishing stop film 3. Further, mask layer 5 which is polished at about the same rate with the interlayer insulating film 2 is deposited on the polishing stop film 3 at a thickness of about 100 nm to about 500 nm, for example, by means of CVD or sputtering.

A silicon oxide film, for example, is used as the mask layer 5. The main surface of the semiconductor substrate 10 is polished by CMP. The polishing cloth 4 contacts the mask layer 5 on the main surface (FIG. 5(a)). The mask layer 5 at the convex portions 22 is polished and removed during the polishing by using the polishing cloth 4.

Figure 5B:
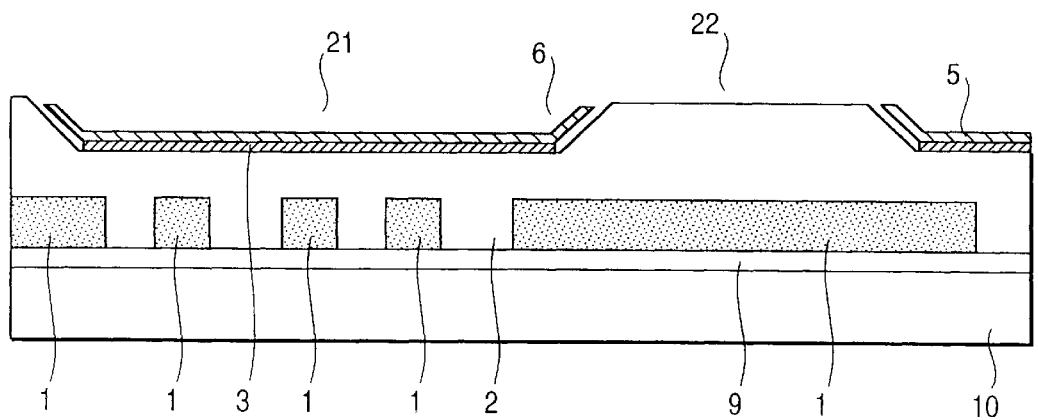

The polishing stop film 3 at the convex portions 22 and the side wall of the step are etched and removed by, for example, dry etching on condition that the mask layer 5 is not etched (FIG. 5(b)).

Figure 5C:
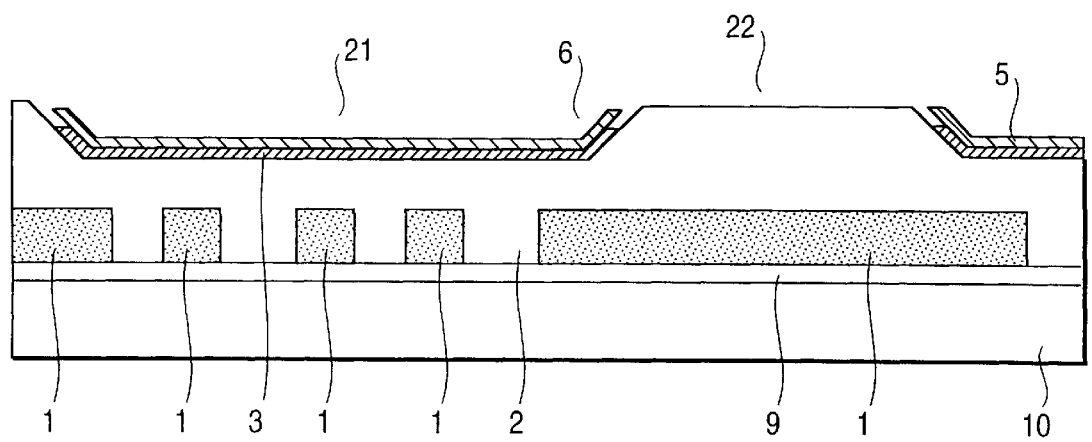
Figure 5D:
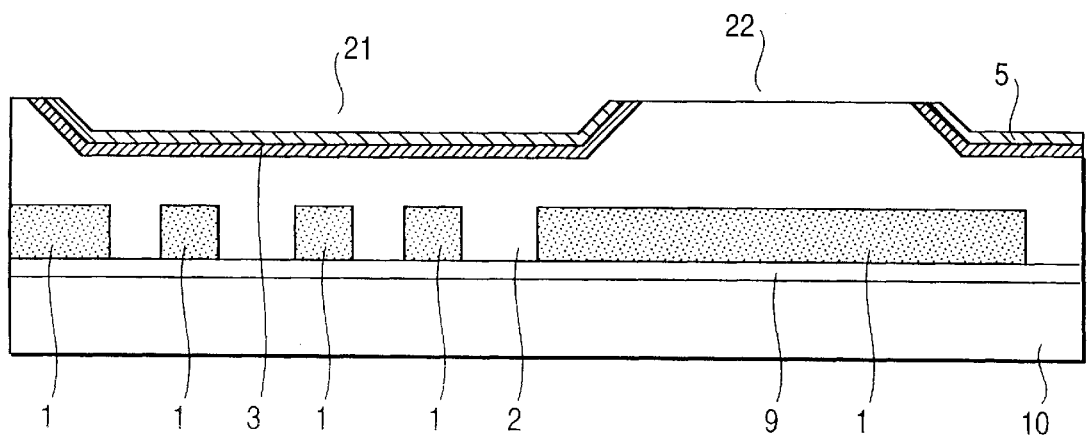

Then, depending on the etching condition, three conditions may exist: 1) the polishing stop film 3 is removed except for along the bottom of the concave portion 21 as shown in FIG. 5(b), 2) the polishing stop film 3 is removed up to the middle of the side wall of the concave portion 21 as shown in FIG. 5(c) and 3) only the polishing stop film 3 at the convex portions 22 is removed as shown in FIG. 5(d).

The thickness of the mask layer 5 may be changed by the etching condition for removing the polishing stop film 3. Because the polishing stop film 3 on the side wall of the step has been etched and removed as shown in FIG. 5(b) in the present embodiment, the part 6 of the mask layer 5 at the side wall of the step which lies above the polishing stop film 3 is put into a floating state. Then, the interlayer insulating film 2 at the convex portions 22 and the mask layer 5 at the concave portion 21 are removed at the same time by CMP. After the polishing, the interlayer insulating film 2 at the concave portion 21 is not removed and the interlayer insulating film 2 is flattened completely as shown in FIG. 6.

While the polishing cloth 4 contacts with the polishing stop film 3 at the concave portion 21 of the interlayer insulating film 2 when the step 6 decreases, the polishing stop film 3 is not removed and the interlayer insulating film 2 at the concave portion 21 is not removed because the rate at which the polishing stop film 3 is polished is very slow.

When a material of mask layer 5 used as mask layer 5 is one that is polished at a rate slower than the rate at which the film to be polished is polished, the step of the film to be polished is flattened by CMP after etching the polishing stop film 3 and further after removing the mask layer 5 by etching utilizing chemical reactions. That is, because the CMP is implemented after leaving the polishing stop film 3 only at the concave portion 21 without using the lithographic technology, flattening can be readily performed at low cost. Further, because there exists no polishing stop film on the side wall of the step, the polishing may be performed readily.

A fourth embodiment will be explained with reference to FIGS. 7 and 8.

Figure 7A:
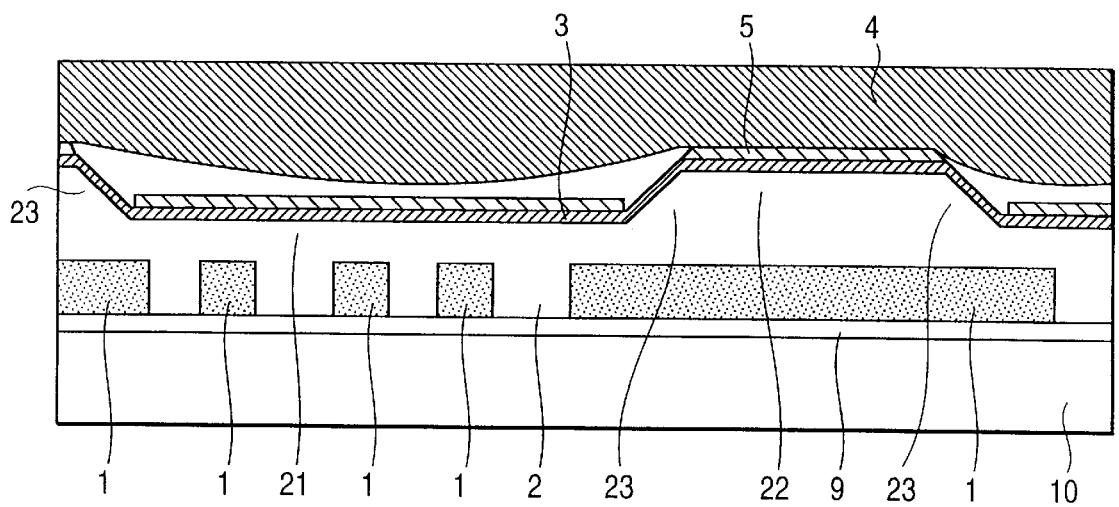
FIGS. 7(a) and 7(b) are section views of a semiconductor substrate for explaining a fourth illustrative embodiment of the present invention.
Figure 7B:
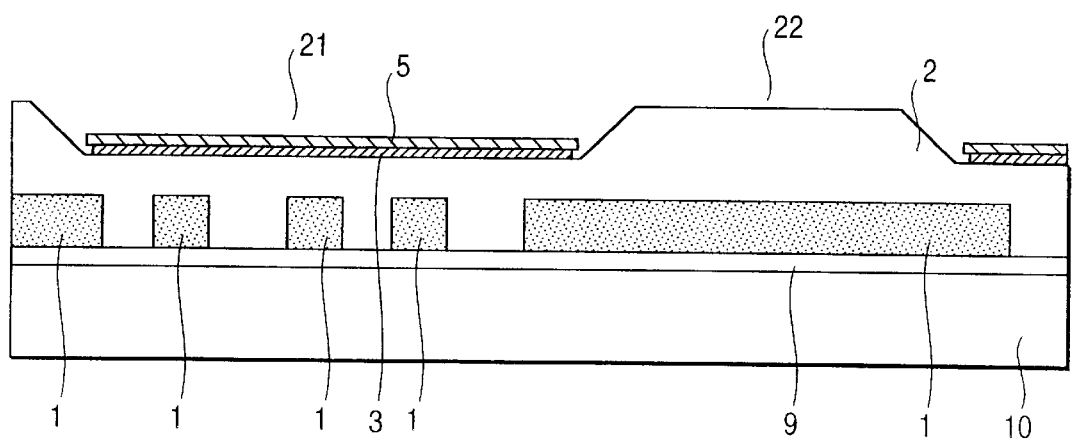

Wiring lines 1 made of aluminum or the like are formed on the insulating film 9 made of SiO$_2$ of the like on the surface of the silicon semiconductor substrate 10. An insulating film 2, such as a CVD SiO$_2$ is deposited on wiring lines 1 by CVD with bias-sputtering. In case of the CVD with the bias-sputtering, etching of corners at the both sides of a convex portions 22 and the deposition thereof on the whole surface of the substrate are implemented at the same time. The interlayer insulating film 2 above the wiring lines 1, especially the wide wiring lines, is thick in shape above regions where the wide wire is thick. On the other hand, interlayer insulating film 2 above the narrow wiring lines is thin as shown in FIG. 7(a). Accordingly, the interlayer insulating film 2 having an irregularity is formed on the substrate. A polishing stop film 3 made of carbon for example is deposited at a thickness of about 50 nm on the whole surface of the interlayer insulating film 2 by means of CVD or sputtering. A material which is polished at a very slow rate, for example as slow as less than about ⅒ of the rate at which the interlayer insulating film 2 is polished, is used as the polishing stop film 3. The thickness of the polishing stop film 3 is determined taking the height of the wire, conditions of the CMP and the material of the polishing stop film 3 into consideration. Further, a mask layer 5 which is polished at about the same rate with the interlayer insulating film 2 is deposited on the polishing stop film 3 at a thickness of about 100 nm, for example, by means of CVD. A silicon oxide film, for example, is used as the mask layer 5.

Then, the mask layer 5 at the side walls of the steps 23 is etched by sputtering to remove only the mask layer 5. The situation in which no mask layer 5 exists at the side wall 23 of the step as shown in FIG. 7(a) may be formed also by CVD with sputtering.

The surface of the semiconductor substrate 10 is polished by CMP. The polishing cloth 4 contacts with the mask layer 5 at the convex portions 22 (FIG. 7(a)).

The mask layer 5 at the convex portions 22 is polished and removed by the polishing. The main surface of the semiconductor substrate 10 is etched to remove the polishing stop film 3 at the exposed convex portions 22 and at the side wall of the step (FIG. 7(b)). Next, the interlayer insulating film 2 at the convex portions 22 and the mask layer 5 at the concave portion 21 are polished by the CMP. After the polishing, the interlayer insulating film 2 at the concave portion 21 is not removed and the interlayer insulating film 2 is flattened completely as shown in FIG. 8. Although the polishing cloth 4 contacts with the polishing stop film 3 at the concave portion 21 of the interlayer insulating film 2, i.e. the film to be polished, when the step decreases, the polishing stop film 3 and the film to be polished at concave portion 21 are not removed because the rate at which the polishing stop film 3 is polished is very slow.

When a material which has slower polishing rate than that of the film to be polished is used as the mask layer 5, the step of the interlayer insulating film 2 is flattened by CMP after removing the polishing stop film 3 and the mask layer 5 by etching utilizing chemical reactions.

Because CMP may be implemented after the polishing stop film 3 remains only at the concave portion 21 without using the lithographic technology, the flattening may be readily performed at low cost. Further, because there exists no polishing stop film on the side wall of the step, polishing can be performed easily.

No mask layer is formed on the side wall of the step when CVD with bias-sputtering is used. Then, no horn shape (see reference numeral (6) in FIG. 5(b)), which is created after the polishing stop film 3 under the mask layer 5 at the step is removed, is formed. Because the interlayer insulating film 2 at the convex portions 22 and mask layer 5 at the concave portion 21 can be removed at the same time, the yield of the products improves.

A fifth embodiment will be explained with reference to FIGS. 9 and 10.

In the present embodiment, a method for filing a filler such as an insulating material into a trench formed on the surface of a semiconductor substrate and for flattening the surface thereof will be explained. This method is applied to form a buried isolation for semiconductor elements.

A trench 7 having a predetermined size is formed on the main surface of a silicon semiconductor substrate 10. An insulating film 8 such as a CVD SiO$_2$ film is deposited on the main surface of the semiconductor substrate 10 including the trench 7. Because the trench is selectively formed and disposed on the surface of the semiconductor substrate 10, irregularities are created on the surface of the insulating film 8. A concave portion 81 is created on the surface of the insulating film 8 in a region above the trench 7 and a convex portion 82 is formed in a region above the insulating film 8 where the trench 7 is not created. A polishing stop film 3 made of carbon, for example, is deposited at a thickness of about 10 mn on the whole surface of the insulating film 8 by means of CVD or sputtering. A material which is polished at a very slow rate, i.e. as slow as less than about ⅒ of the rate at which the insulating film 8 is polished, is used as the polishing stop film 3. The thickness of the polishing stop film 3 is determined in consideration of the height of the wire, conditions of the CMP and the material of the polishing stop film 3. Further, a mask layer 5 which is polished at about the same rate with the insulating film 8 is deposited on the polishing stop film 3 at a thickness of about 100 nm to about 500 nm, for example, by means of CVD or sputtering. A silicon oxide film may be used as the mask layer 5. The main surface of the semiconductor substrate 10 is polished by CMP.

Figure 9A:
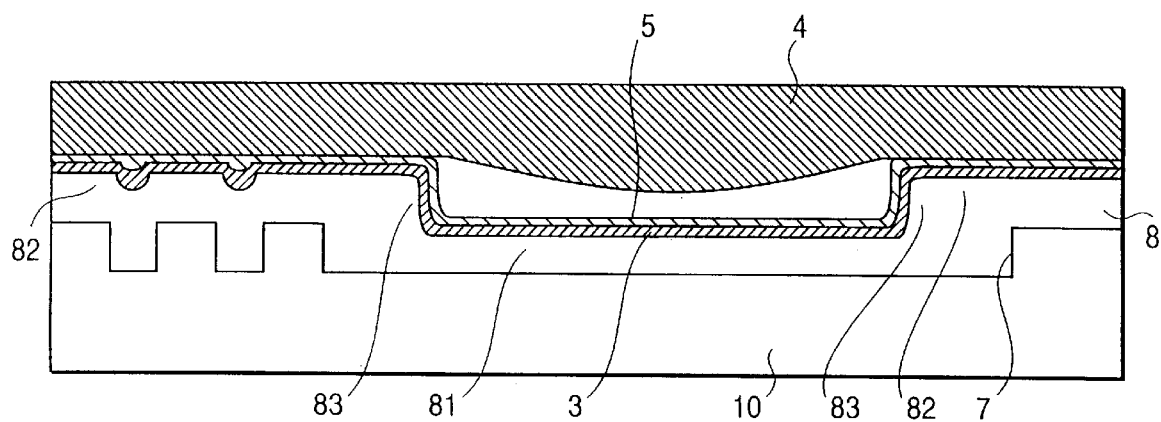
FIGS. 9(a) through 9(d) are section views of a semiconductor substrate for explaining a fifth illustrative embodiment of the present invention.

The polishing cloth 4 used in the polishing contacts mask layer 5 at the convex portion 82 on the main surface (FIG. 9(a)). The mask layer 5 at the convex portion 82 is polished and removed during the polishing. At this time, the mask layer 5 at the concave portion 81 is not removed.

Figure 9B:
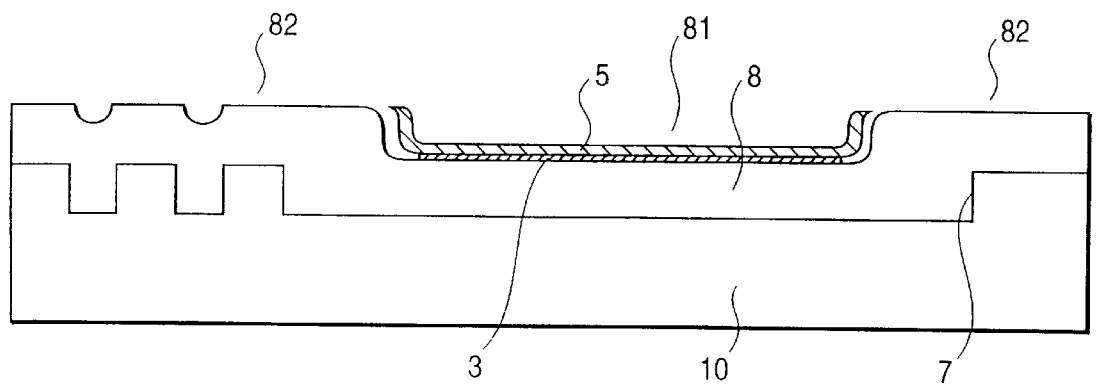

The convex portion 82 of the insulating film 8 and the polishing stop film 3 on the side wall of the steps 83 are removed dry etching, for example, which is well known in the semiconductor technology on condition that the mask layer 5 is not etched (FIG. 9(b)).

Figure 9C:
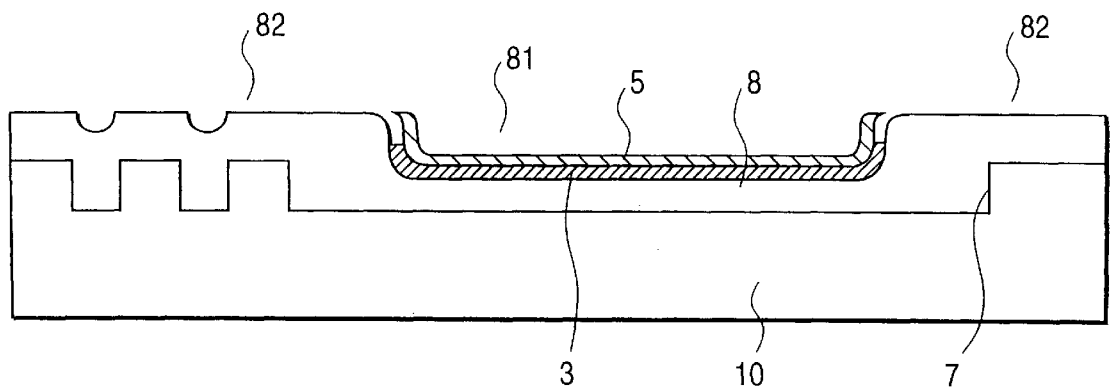
Figure 9D:
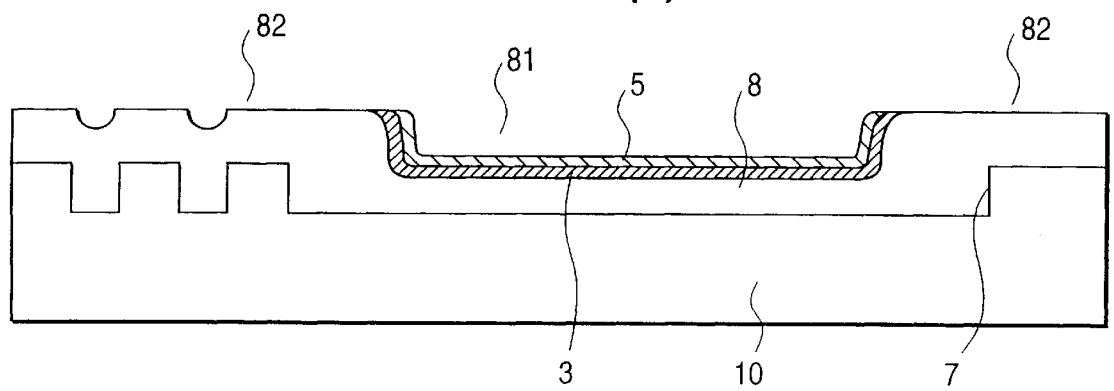

Then, depending on the etching condition, three conditions may exist: 1) the polishing stop film 3 is removed except for along the bottom of the concave portion 81 as shown in FIG. 9(b), 2) the polishing stop film 3 is removed up to the middle of the side wall of the concave portion 81 as shown in FIG. 9(c) and 3) only the polishing stop film 3 at the convex portion 82 is removed as shown in FIG. 9(d).

The thickness of the mask layer 5 may be changed by the etching condition for removing the polishing stop film 3. Because the polishing stop film 3 on the side walls of the steps 83 are removed, the horn shape part 6 of the mask layer 5 at the side wall of the steps 83 which had lied above the polishing stop film 3 is put into a floating state as shown in FIG. 9(b). Then, the interlayer insulating film 2 at the convex portion 82 and the mask layer 5 at the concave portion 81 are removed at the same time by CMP. After the polishing, the insulating film 8 at concave portion 81 is not removed and the insulating film 8 is flattened completely as shown in FIG. 10. The insulating film 8 is flattened and the insulating film 8 at the region other than the trench 7 can be removed completely at the same time by leveling off the polishing stop film 3 with the convex portion 82 on the surface of the semiconductor substrate 10, as shown in FIG. 10. Thus, the elements are isolated.

This method is also effective in flattening an insulating film formed on the surface of the semiconductor substrate which has irregularities on its surface by deposition, sputtering or etching.

The polishing cloth 4 contacts with the polishing stop film 3 at the concave portion 81 of the film to be polished. When the step decreases, the polishing stop film 3 is not removed and the film to be polished at the concave portion 81 is not removed because the rate at which the polishing stop film 3 is polished is very slow.

When a material used as mask layer 5 masking 5, which is polished at a slower rate than that of the film to be polished is polished, the step of the film to be polished is flattened by CMP after etching the polishing stop film 3 and the mask layer 5. Accordingly, because CMP is implemented after leaving the polishing stop film 3 only at the concave portion 81 without using the lithographic technology, flattening can be readily performed at low cost.

A sixth embodiment will be explained with reference to FIGS. 11(a) and 11(b).

A method of the present embodiment for forming buried wiring lines by flattening a conductive material filling a trench in an insulating film formed on the main surface of a semiconductor substrate will be explained below.

An interlayer insulating film 2 such as CVD $SiO_2$ film is deposited on the main surface of a silicon semiconductor substrate 10. Then, this interlayer insulating film 2 is patterned to form a wiring trench 11. A metallic film 12, for example made of Cu or Cu alloy, is deposited on the interlayer insulating film 2 including the wiring trench 11. A concave portion 121 is created in a region of the interlayer insulating film 2 above the wiring trench 11 and a convex portion 122 is created in a region of the interlayer insulating film 2 where no wiring trench is formed. A polishing stop film 3, for example, made of carbon, for example, is deposited at a thickness of about 10 nm on the whole surface of the metallic film 12 by means of CVD deposition or sputtering. A material which is polished at a very slow rate, i.e. as slow as less than 1/10 of that at which the metallic film 12 is polished, is used as the polishing stop film 3. The thickness of the polishing stop film 3 is determined in consideration of height of the wire, conditions of the CMP and the material of the polishing stop film 3. Further, a mask layer 5, which is polished at about the same rate as the metallic film 12, is deposited on the polishing stop film 3 at a thickness of about 100 nm to about 500 nm, for example, by CVD or sputtering. And the main surface of the semiconductor substrate 10 is polished by CMP under such conditions.

Figure 11A:
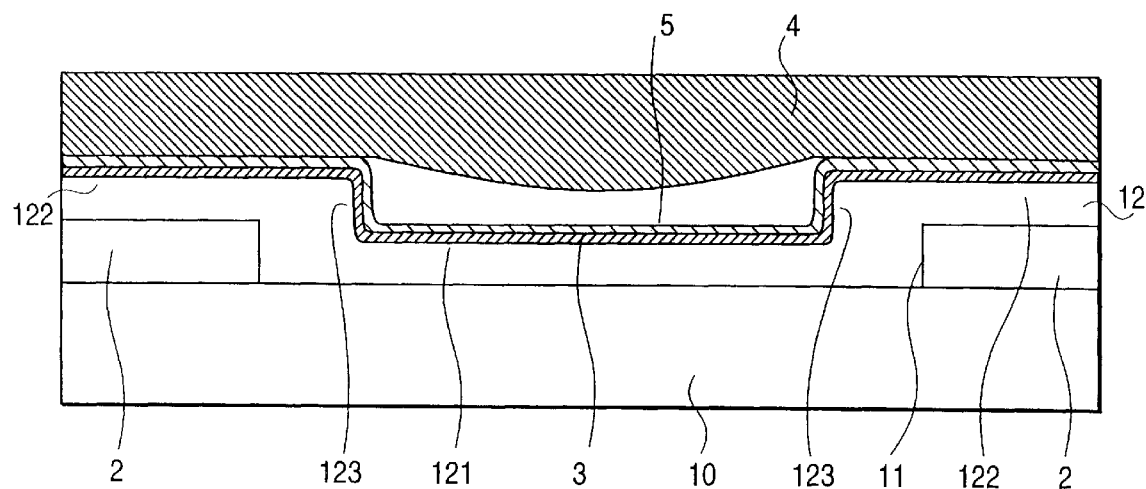
FIGS. 11(a) and 11(b) are section views of a semiconductor substrate for explaining a sixth illustrative embodiment of the present invention.
Figure 11B:
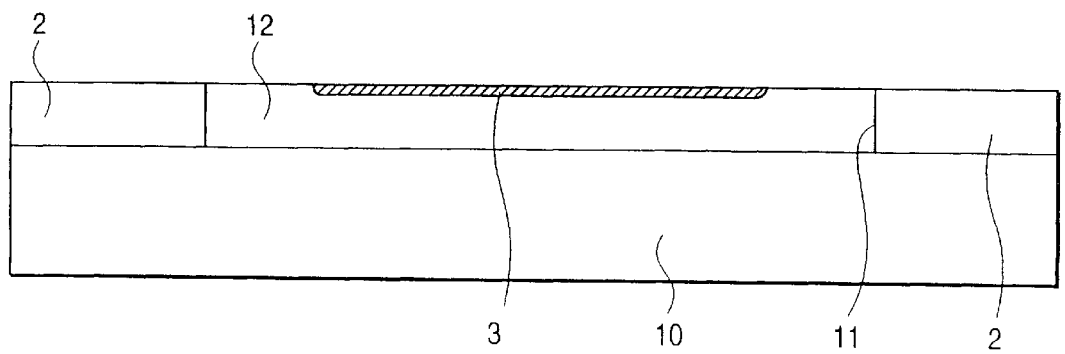

The polishing cloth 4 used in the polishing contacts the mask layer 5 at the convex portion 122 on the main surface (FIG. 11(a)). The mask layer 5 at the convex portion 122 is polished and removed by the polishing. Next, the convex portion 122 of the metallic film 12 and the polishing stop film 3 on the side walls of the steps 123 are removed by dry etching, for example, which is well known in the semiconductor technology on condition that the mask layer 5 is not etched. The thickness of the mask layer 5 may be changed by the etching condition for removing the polishing stop film 3. Because the polishing stop film 3 on the side wall of the steps 123 are removed in the present embodiment, the part of the mask layer 5 at the side walls of the steps 123 which had lied above the polishing stop film 3 is put into a floating state.

Then, the metallic film 12 at the convex portion 122 and the mask layer 5 at the concave portion 121 are removed at the same time by CMP. After the polishing, the metallic film 12 at the concave portion 121 is left and the metallic film 12 is flattened completely as shown in FIG. 11(b). Then, the metallic film 12 is flattened and the metallic film 12 out of the trench 11 on the surface of the semiconductor substrate 10 is removed completely because the polishing stop film 3 precludes the cloth 4 from contacting with the metallic film 12. As a result, the metal wiring line can be formed in the wiring trench 11. The wiring trenches 11 are insulated electrically from each other by the interlayer insulating film 2. An interlayer insulating film may be deposited further on the metallic film 12 and the interlayer insulating film 2 which have been leveled off to form an upper wire thereon.

The polishing cloth 4 contacts with the polishing stop film 3 at the concave portion 121 of the metallic film 12, i.e. the film to be polished now. When the steps 123 decreases, the polishing stop film 3 and the metallic film 12 at the concave portion 121 is not removed because the rate at which the polishing stop film 3 is polished is very slow.

When a material which has a slower polishing rate than that of the film to be polished is used as the mask layer 5, the step of the film to be polished is flattened by CMP after removing the polishing stop film 3 and after removing the mask layer 5 by etching utilizing chemical reactions.

Accordingly, because CMP is implemented after leaving the polishing stop film 3 only at the concave portion 121 without using the lithographic technology, the flattening may be readily performed at low cost. Further, the polishing may be performed readily because there is no polishing stop film on the side wall of the step if the polishing stop film 3 is fully removed by etching.

Al or an Al alloy may be used as the metallic film to be buried.

A seventh embodiment will be explained with reference to FIGS. 12 through 14.

A method of the present embodiment for filling a filer such as an insulating material into a trench formed on the surface of a semiconductor substrate and for flattening the surface thereof in the same manner as the fifth embodiment will be explained.

Figure 12A:
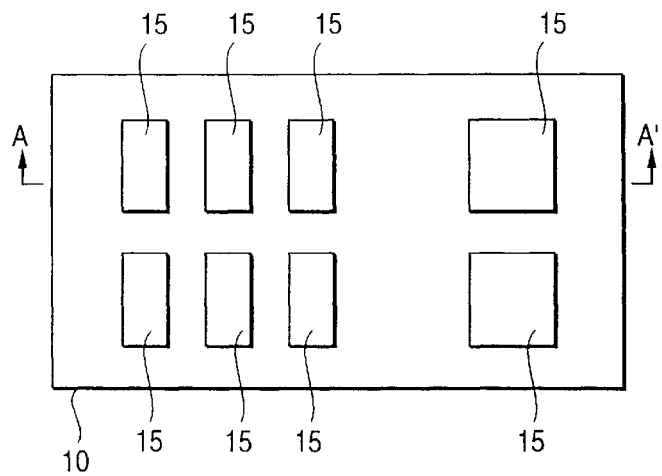
FIGS. 12(a) through 12(c) are plan views of a semiconductor substrate for explaining a groove forming step according to a seventh illustrative embodiment of the present invention.
Figure 12B:
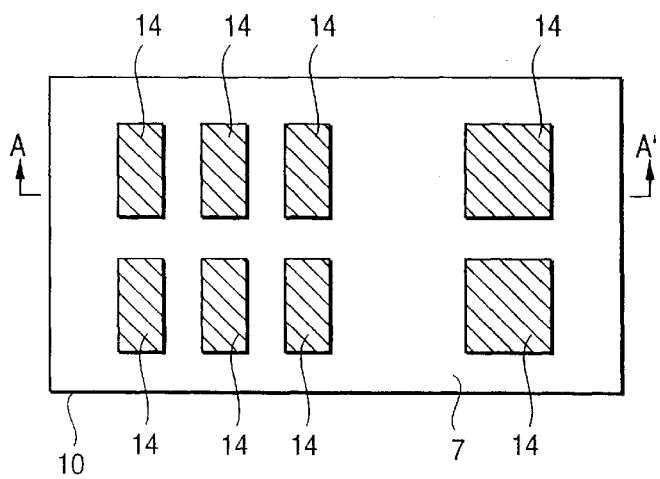
Figure 12C:
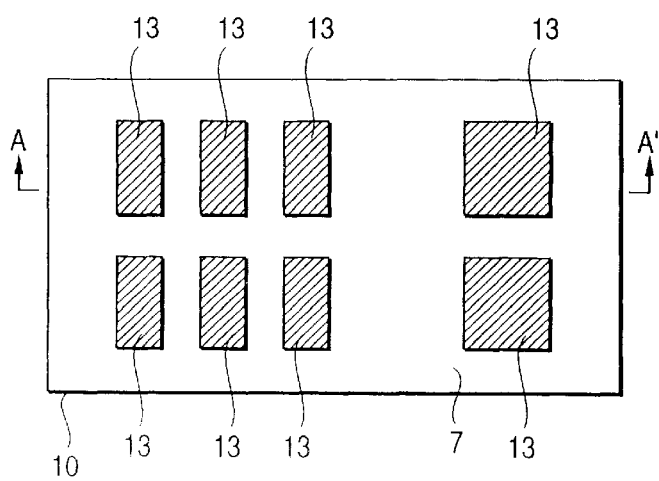
Figure 13A:
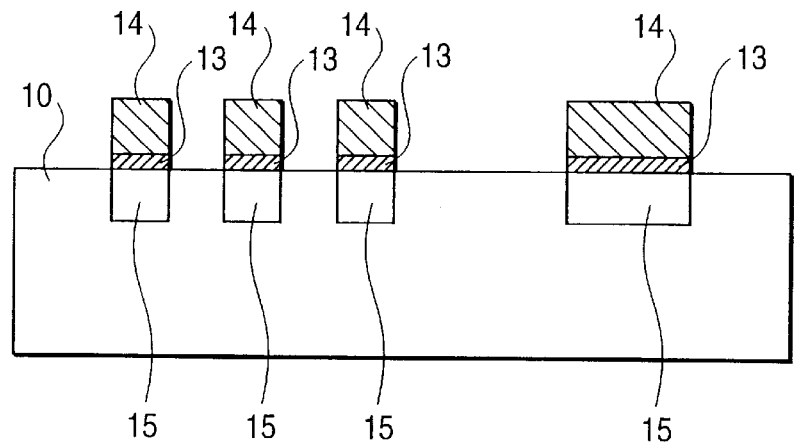
FIGS. 13(a) through 13(c) are further section views of the semiconductor substrate for explaining the groove forming step according to the seventh illustrative embodiment of the present invention.
Figure 13B:
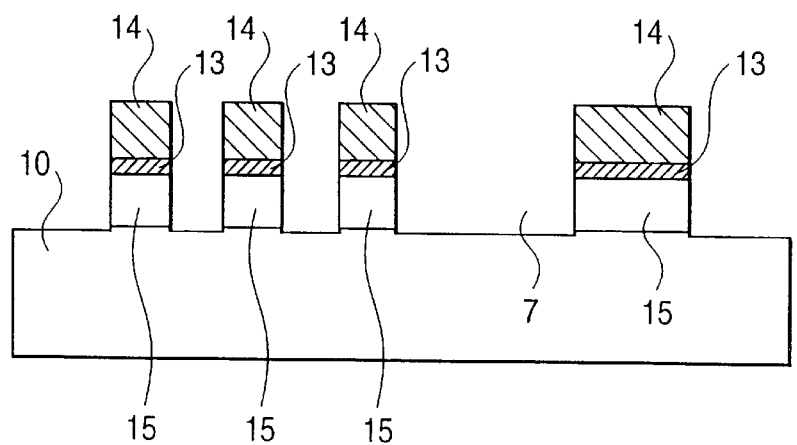
Figure 13C:
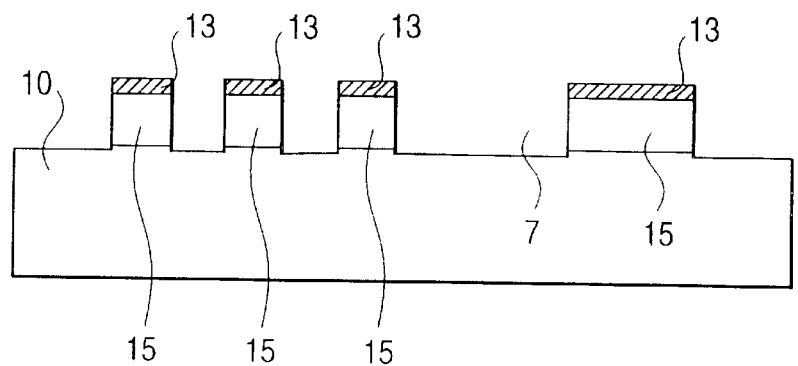
Figure 14A:
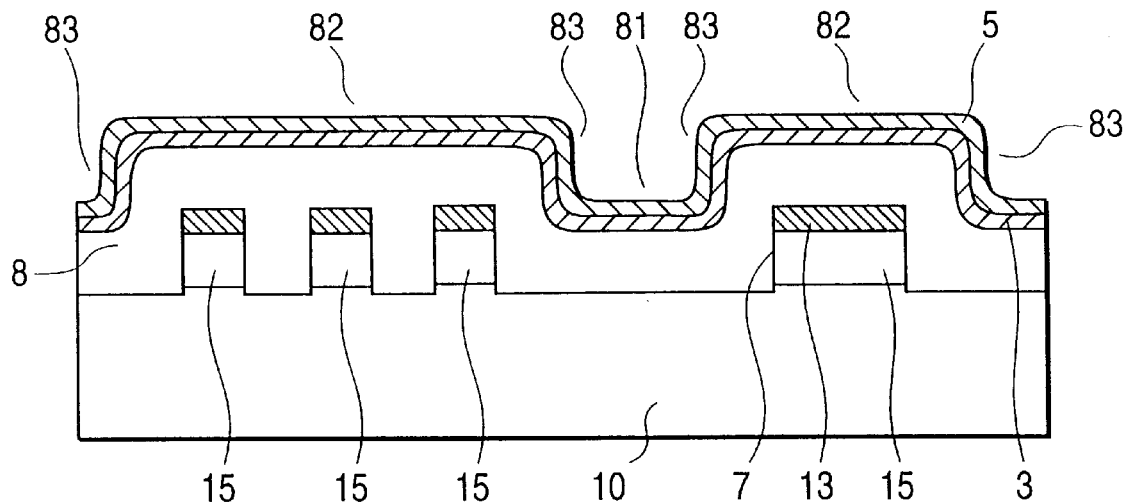
FIGS. 14(a) and 14(b) are further section views of the semiconductor substrate for explaining the seventh illustrative embodiment of the present invention.
Figure 14B:
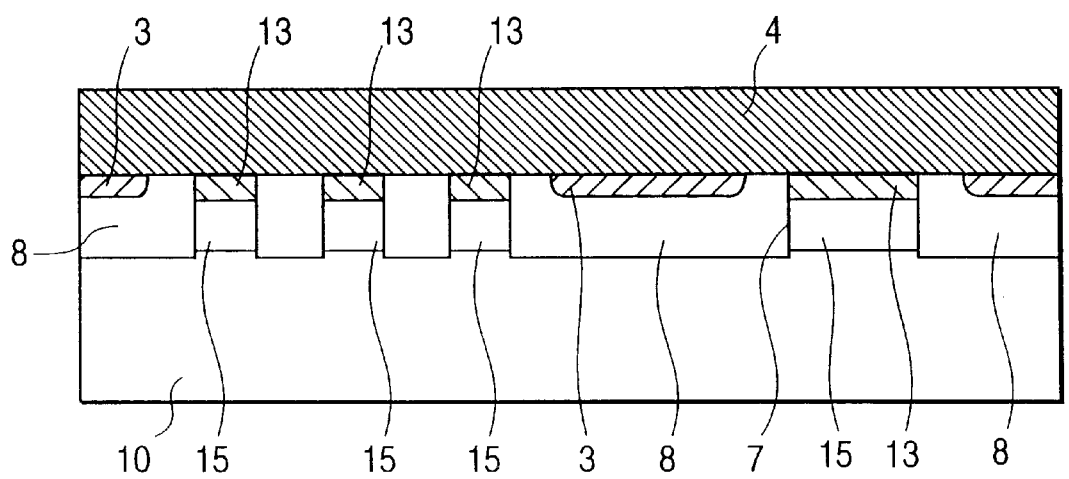
Figure 15:
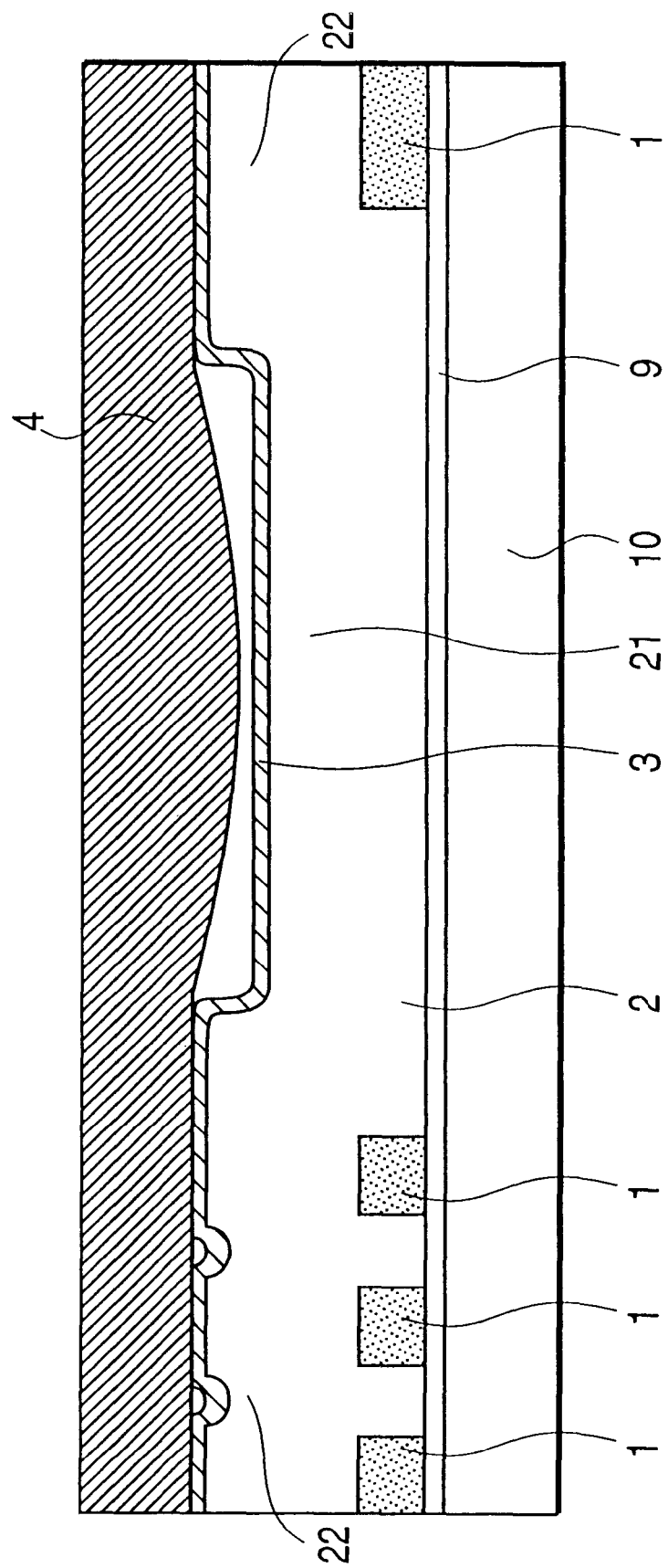
FIG. 15 is a section view of a semiconductor substrate for explaining prior art CMP.
Figure 16:
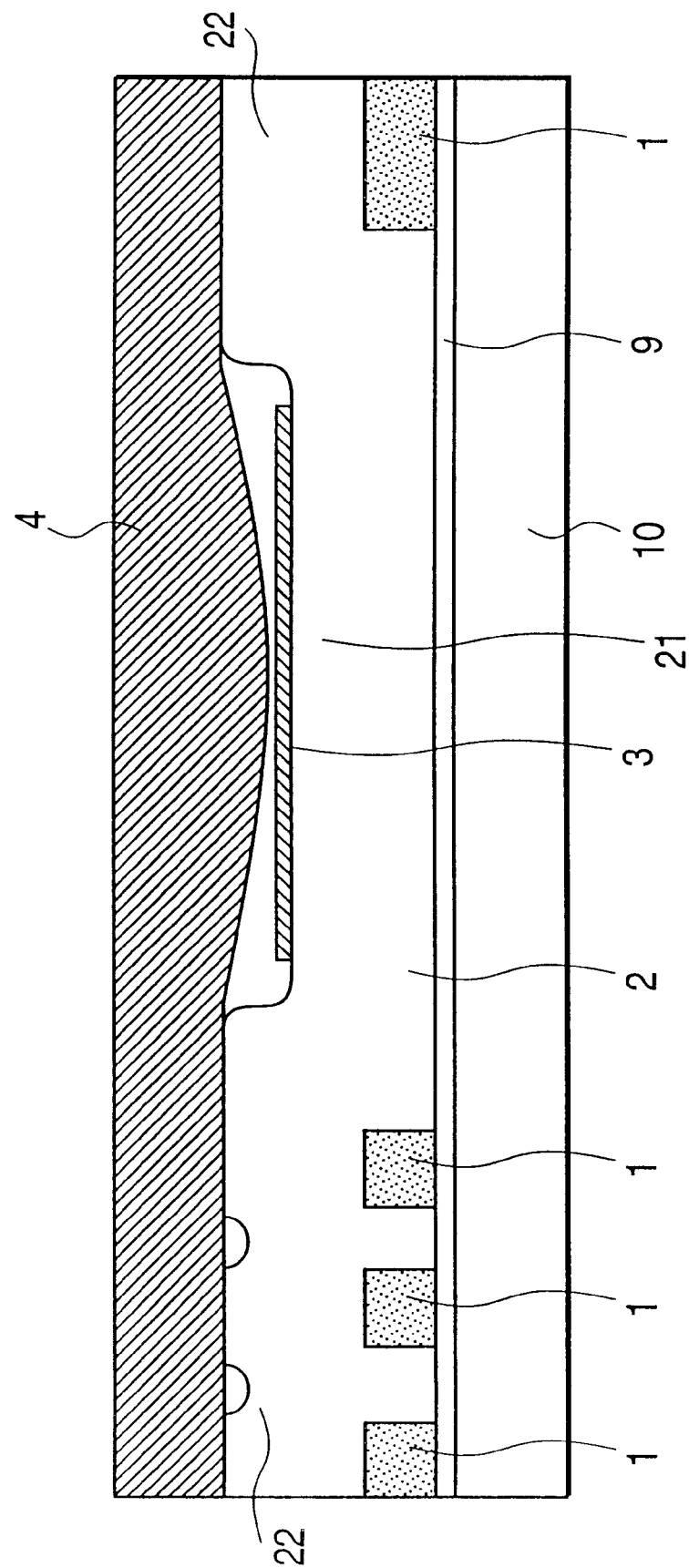
FIG. 16 is a section view of a semiconductor substrate for explaining prior art CMP.
Figure 17A:
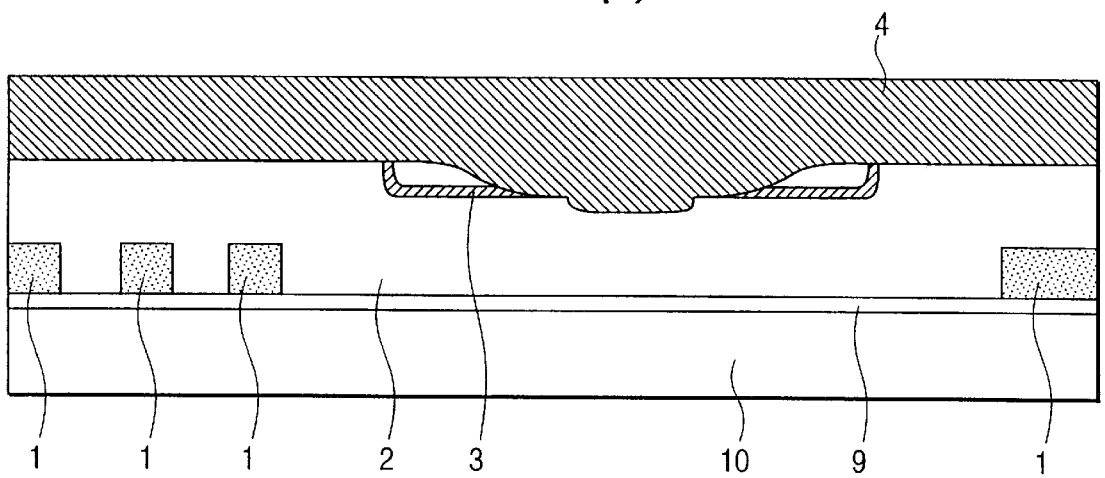
FIGS. 17(a) and 17(b) are section views of a semiconductor substrate for explaining prior art CMP.
Figure 17B:
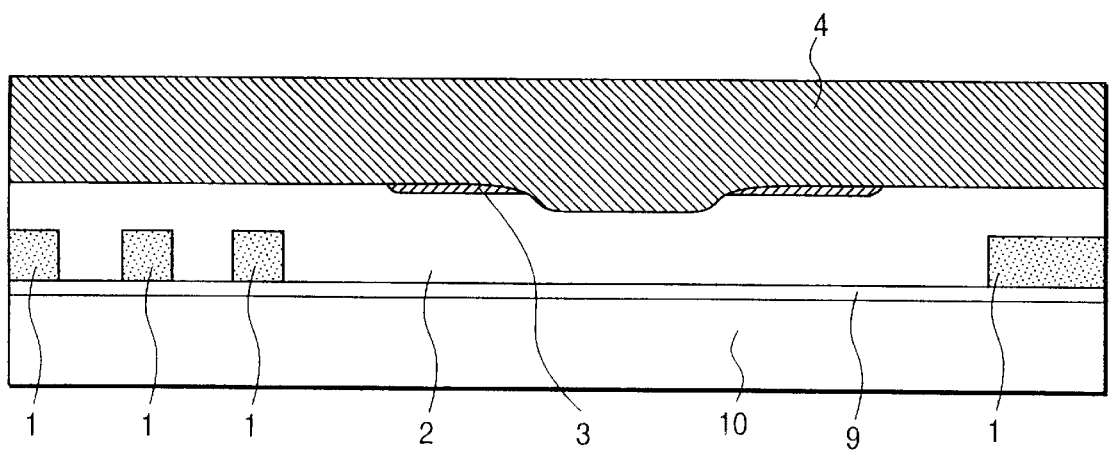

FIGS. 12(a) through 12(c) are plan views of the semiconductor substrate; FIGS. 13(a) through 13(c) are sectional views along A–A' in FIGS. 12(a)–12(c) each other showing steps for forming the trench. FIGS. 14(a) and 14(b) are sectional views of forming steps for flattening the surface. In the semiconductor substrate 10, the trench will be filled a buried isolation. Semiconductor elements 15, which are transistors or the like, are formed surrounded by the buried isolation. (FIGS. 13 and FIGS. 14).

After a trench mask layer 13, is for example made of poly-silicon is formed on the whole surface of the semiconductor substrate 10, a photoresist 14 having a predetermined pattern is disposed on the trench mask layer 13. After trench masks 13 are patterned by using the photoresist 14 as a mask trench forming regions are exposed (FIG. 13(a)). The surface of the semiconductor substrate 10 is etched by Reactive Ion Etching (RIE) or the like while using the trench mask 13 and the photoresist 14 as masks to form trenches 7 on the semiconductor substrate 10 (FIGS. 12(b) and 13(b)). The trenches 7 may be formed by etching with using only the trench mask 13 as the mask after removing the photoresist 14 (FIGS. 12(c) and 13(c)).

An insulating film 8 such as a CVD $SiO_2$ film is deposited on the main surface of the semiconductor substrate 10 including the trenches 7. The trench masks 13 are left on the surface of the element regions 15 and cover their surfaces.

Because the trenches 7 and the semiconductor elements 15 are selectively formed on the surface of the semiconductor substrate 10 and the insulating film 8 fills in the trenches 7, irregularities are created on the surface of the insulating film 8. A concave portion 81 is created on the surface of the insulating film 8 at a region above a trench 7 and a convex portion 82 is formed at a region of the insulating film 8 covering an element region 15. A polishing stop film 3 made of, for example, carbon is deposited at a thickness of about 10 nm on the whole surface of the insulating film 8 by CVD or sputtering. A material which is polished at a very slow rate, i.e. as slow as less than about ¹⁄₁₀ of that at which the insulating film 8 is polished, is used as the polishing stop film 3. The thickness of the polishing stop film 3 is determined in consideration of the wiring line, conditions of the CMP and the material of the polishing stop film 3. The thickness of the insulating film 8 is adjusted so that the polishing stop film 3 on the insulating film 8 filling in the trench 7 and the trench mask 13 on the element region 15 are substantially leveled off on the same plane.

Further, a mask layer 5 which is polished at about the same rate as the insulating film 8 is deposited on the polishing stop film 3 at a thickness of about 100 nm to about 500 nm for example by CVD or sputtering. A silicon oxide film, for example, is used as the mask layer 5. The polishing cloth 4 used in the polishing contacts with the mask layer 5 at the convex portion 82 on the main surface. The mask layer 5 at the convex portion 82 is removed by the polishing.

The convex portion 82 of the insulating film 8 and the polishing stop film 3 on the side walls of the steps 83 are removed by dry etching, for example, which is well known in the semiconductor technology on condition that the mask layer 5 is not etched. Then, the insulating film 2 at the convex portion 82 and the mask layer 5 at the concave portion 81 are removed at the same time by CMP. After the polishing, because the insulating film 8 at the concave portion 81 is not removed; and the insulating film 8 is flattened completely as shown in FIG. 14(b). The insulating film 8 in the region other than the trench 7 on the surface of the semiconductor substrate 10 can be removed completely. In addition, insulating film 8 is flattened because the polishing stop film 3 is formed at a substantially same level with the trench masks 13 on the concave portion 81. Thus, the element regions 15 are isolated from each other by the insulating film 8 which is buried in the trenches 7. After the polishing, the polishing stop film 3 on the insulating film 8 and the trench masks 13 on the element region 15 are removed.

Because the trench mask 13 plays the same role as the polishing stop film 3, the CMP can be performed reliably without increasing the processing steps. Further, the step for removing the trench mask 13 and the polishing stop film 3 is facilitated, when they are formed by the same material (e.g. carbon, poly-silicon, silicon nitride).

According to the present invention, the polishing stop film may be formed at the concave portion by self-alignment and a considerable increase of the manufacturing cost of the semiconductor device can be suppressed because a photomask lithography steps for patterning the polishing stop film is unnecessary. Further, because the polishing stop film exists only at the concave portion, the material of the polishing stop layer can have a very large polishing selection ratio.

While there has been shown and described various embodiments of the present invention it will be evident to those skilled in the art that various modifications may be made thereto without departing from the scope of the invention which is set forth in the appended claims.

What is claimed is:

1. A self-alignment method for manufacturing a semiconductor device having a layer containing at least one irregularity, comprising the steps of:

forming a polishing stop film on said layer;

forming a mask layer on said polishing stop film;

polishing a whole surface of said semiconductor device in order to polish said mask layer on a high level portion of said layer corresponding to said at least one irregularity;

removing said polishing stop film on the high level portion of said layer corresponding to said at least one irregularity;

polishing the high level portion of the irregularity of said layer corresponding to said at least one irregularity, wherein said polishing stop film has a greater polishing rate than that of said mask layer.

2. A method for manufacturing a semiconductor device according to claim 1, wherein the polishing steps are performed by chemical-mechanical polishing.

3. A method for manufacturing a semiconductor device according to claim 1, wherein said first film is removed by isotropic etching in said removing step.

4. A method for manufacturing a semiconductor device according to claim 1, wherein said first film is removed only on the high level portion in said removing step.

5. A method for manufacturing a semiconductor device according to claim 1, wherein said first film is removed only on said high level portion, or a sidewall between said high level portion and a low level portion.

6. A method for manufacturing a semiconductor device according to claim 1, wherein said first film is removed only on said high level portion, or a portion of a side wall between said high level portion and a low portion.

7. A method for manufacturing a semiconductor device according to claim 1, wherein said first film has a polishing rate which is less than 1/10 of a polishing rate of said layer.

8. A method for manufacturing a semiconductor device according to claim 1, wherein said first film is selected from a group comprising carbon, $Si_3N_4$, poly-Si and metal silicide.

9. A method for manufacturing a semiconductor device according to claim 1, further comprising the step of:

removing said second film after removing said first film.

10. A method for manufacturing a semiconductor device according to claim 9, wherein said second film is removed by chemical mechanical polishing.

11. A method for manufacturing a semiconductor device according to claim 1, wherein said layer is formed by chemical vapor deposition with bias sputtering.

12. A method for manufacturing a semiconductor device according to claim 1, wherein said second film is formed by chemical vapor deposition with sputtering.

13. A method for manufacturing a semiconductor device according to claim 1, wherein said layer is a metal layer.

14. A method for manufacturing a semiconductor device according to claim 13, wherein said metal is selected from a group comprising Au, Al, Cu, an alloy of Cu and an alloy of Al.

15. A method for manufacturing a semiconductor device according to claim 1, wherein said layer is an insulating layer.

16. A method for manufacturing a semiconductor device according to claim 15, wherein said insulating layer is $SiO_2$ layer.

17. A self-alignment method for manufacturing a semiconductor device having a layer containing at least one irregularity, comprising the steps of:

forming a polishing stop film on said layer;

forming a mask layer on said polishing stop film;

polishing a whole surface of said semiconductor device in order to polish said mask layer on a high level portion of said layer corresponding to said at least one irregularity;

removing said polishing stop film on the high level portion of said layer corresponding to said at least one irregularity; and polishing a surface of said layer, wherein said polishing stop film has a greater polishing rate than that of said mask layer.

18. A self-alignment method for manufacturing a semiconductor device having a trench on a semiconductor substrate, comprising the steps of:

forming a polishing stop film on a layer to be flattened, said layer having at least one irregularity;

forming a mask layer on said polishing stop film;

polishing a whole surface of said semiconductor device in order to polish said mask layer on high level portion of said layer;

removing said polishing stop film on said high level portion of said layer; and polishing a surface of said layer.

19. A self-alignment method for manufacturing a semiconductor device having a trench on a semiconductor substrate, comprising the steps of:

forming a polishing stop film on a layer to be flattened, said layer having at least one irregularity;

forming a mask layer on said polishing stop film;

polishing a whole surface of said semiconductor device in order to polish said mask layer on a high level portion of said layer;

removing said polishing stop film on said high level portion of said layer; and polishing a high level portion of said layer.

20. A self-alignment method for manufacturing a semiconductor device having a semiconductor element region on a semiconductor substrate, comprising the steps of:

forming a trench surrounding said semiconductor element region;

forming an insulating film on said substrate;

forming a polishing stop film on said insulating film;

forming a mask layer on said polishing stop film;

polishing a whole surface of said semiconductor device in order to polish said mask layer on a high level portion of said insulating film;

removing said polishing stop film on said high-level portion of said insulating film; and polishing said high level portion of said insulating film.

21. A self-alignment method for manufacturing a semiconductor device having a semiconductor element region on a semiconductor substrate, comprising the steps of:

forming a trench surrounding said semiconductor element region;

forming an insulating film on said substrate;

forming a polishing stop film on said insulating film;

forming a mask layer on said polishing stop film;

polishing a whole surface of said semiconductor device in order to polish said mask layer on a high level portion of said insulating film;

removing said polishing stop film on said high level portion of said insulating film; and polishing a surface of said insulating film.

22. A self-alignment method for manufacturing a semiconductor device comprising the steps of:

forming a film to be polished;

forming a polishing stop film;

forming a mask layer;

implementing a first polishing of a whole surface of said semiconductor device;

etching said polishing stop film; and implementing a second polishing.

* * * * *